(12) United States Patent
Allen et al.

(10) Patent No.: US 7,867,689 B2
(45) Date of Patent: Jan. 11, 2011

(54) METHOD OF USE FOR PHOTOPATTERNABLE DIELECTRIC MATERIALS FOR BEOL APPLICATIONS

(75) Inventors: Robert D. Allen, San Jose, CA (US); Phillip Brock, Sunnyvale, CA (US); Blake W. Davis, Hollister, CA (US); Qinghuang Lin, Yorktown Heights, NY (US); Robert D. Miller, San Jose, CA (US); Alshakim Nelson, Freemont, CA (US); Ratnam Sooriyakumaran, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 102 days.

(21) Appl. No.: 11/750,356

(22) Filed: May 18, 2007

(65) Prior Publication Data

US 2008/0286467 A1    Nov. 20, 2008

(51) Int. Cl.
  G03F 7/038    (2006.01)
  G03F 7/075    (2006.01)
  G03F 7/20     (2006.01)
  G03F 7/30     (2006.01)
  G03F 7/40     (2006.01)

(52) U.S. Cl. .................. 430/270.1; 430/311; 430/325; 430/328; 430/330; 430/905; 430/907; 430/919; 430/920; 430/921; 430/925

(58) Field of Classification Search .............. None
See application file for complete search history.

(56) References Cited

U.S. PATENT DOCUMENTS

| 4,371,605 A | 2/1983 | Renner |
| 5,538,818 A | 7/1996 | Kamon |
| 5,789,460 A | 8/1998 | Harkness et al. |
| 6,087,064 A | 7/2000 | Lin et al. |
| 6,187,505 B1 | 2/2001 | Lin et al. |
| 6,613,834 B2 | 9/2003 | Nakata et al. |
| 6,703,181 B1 * | 3/2004 | Hayashi et al. .......... 430/270.1 |
| 6,743,885 B2 | 6/2004 | Yahagi et al. |
| 6,967,222 B2 | 11/2005 | Khanarian et al. |

(Continued)

OTHER PUBLICATIONS

Office Action (Mail Date Oct. 30, 2008) for U.S. Appl. No. 11/789,902, filed Apr. 25, 2007; Confirmation No. 1934.

(Continued)

*Primary Examiner*—Sin J. Lee
(74) *Attorney, Agent, or Firm*—Schmeiser, Olsen & Watts

(57) ABSTRACT

A method. The method includes dip coating a film of a composition on a silicon wafer substrate. The composition includes a polymer blend of a first polymer and a second polymer. The first polymer is a substituted silsesquioxane copolymer. The second polymer is a polysilsesquioxane having silanol end groups. The composition includes a photosensitive acid generator, an organic base, and an organic crosslinking agent. The film is patternwise imaged and at least one region is exposed to radiation having a wavelength of about 248 nanometers. The film is baked, resulting in inducing crosslinking in the film. The film is developed resulting in removal of base-soluble unexposed regions of the film, wherein a relief pattern from the film remains. The relief pattern is cured at a temperature between about 300° C. and about 450° C., and the curing utilizes a combination of thermal treatment with UV radiation.

21 Claims, 4 Drawing Sheets

U.S. PATENT DOCUMENTS

| | | | |
|---|---|---|---|
| 6,992,115 | B2 | 1/2006 | Hawker et al. |
| 7,041,748 | B2 | 5/2006 | Lin et al. |
| 7,056,840 | B2 | 6/2006 | Miller et al. |
| 7,072,563 | B2 | 7/2006 | Shelnut et al. |
| 7,072,565 | B2 | 7/2006 | Shelnut et al. |
| 7,261,992 | B2 | 8/2007 | Sooriyakumaran et al. |
| 7,261,994 | B2 | 8/2007 | Hosono et al. |
| 7,318,992 | B2 | 1/2008 | Kawana et al. |
| 7,355,384 | B2 | 4/2008 | Faust |
| 7,361,444 | B1 | 4/2008 | Angelopoulos et al. |
| 7,399,581 | B2 | 7/2008 | Allen et al. |
| 2004/0137241 | A1* | 7/2004 | Lin et al. ............ 428/447 |
| 2004/0229158 | A1 | 11/2004 | Meador et al. |
| 2005/0221225 | A1 | 10/2005 | Kawana et al. |
| 2006/0105181 | A1 | 5/2006 | Lin et al. |
| 2007/0009828 | A1 | 1/2007 | Tamura et al. |
| 2008/0150091 | A1 | 6/2008 | Lin |

OTHER PUBLICATIONS

Watanabe et al., "Silicon-containing resist for phase-shifting masks," J. Vac Sci. Technol. B, 9 (6), Nov./Dec. 1991, pp. 3436-3439.

Sakata et al., "A Novel Electron Beam Resist System—Acid Catalyzed Conversion of Poly (DI-t-Butoxysiloxane) into Glass," J. Photopolym. Sci. Technol., vol. 5, No. 1, 1992, pp. 181-190.

Namatsu et al., "Three dimensional siloxane resist for the formation of nanopatterns with minimum linewidth fluctuations," J. Vac. Sci. Technol. B 16(1), Jan. /Feb. 1998, pp. 69-76.

Medeiros et al., "Recent progress in electron-beam resists for advanced mask-making,"IBM J. Res & Dev., vol. 45, No. 5, Sep. 2001, pp. 639-650.

* cited by examiner

Before Cure

After Cure

Before Cure

After Cure

METHOD OF USE FOR PHOTOPATTERNABLE DIELECTRIC MATERIALS FOR BEOL APPLICATIONS

FIELD OF THE INVENTION

The invention relates generally to on-chip electrical insulators used in integrated circuits, and more specifically, silicon-containing polymer blends as photopatternable dielectric materials.

BACKGROUND OF THE INVENTION

The continuous shrinking in dimensions of electronic devices utilized in ultra-large scale semiconductor integrated (ULSI) circuits in recent years may have resulted in increasing the resistance of the back-end-of-the-line (BEOL) metallization without concomitantly decreasing the interconnect capacitances. Interconnects may be scaled to higher aspect ratios (a height to width ratio of typically greater than 3:1) to mitigate the resistance increases, which may lead to increased capacitances. This combined effect may increase signal delays in ULSI electronic devices.

The materials may be patterned by several patterning and sacrificial masking materials which may include photoresist polymers, via fill materials. Following the lithographic patterning of the masking layer, a series of etching steps may be employed to transfer the pattern from the photoresist to each of the layers underneath, including the insulating layer. The patterning of insulating materials may require as many as seven layers, some of which may be removed after patterning, resulting in a complex and inefficient process.

It would thus be highly desirable to provide a material which can reduce the integration complexity and processing steps required, and does not require costly photoresist polymers and/or significantly reduces etching processes.

SUMMARY OF THE INVENTION

The present invention relates to a composition comprising:

a polymer blend comprising a first polymer and a second polymer, wherein said first polymer is described by the general formula:

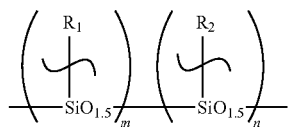

wherein, m and n are integers greater than zero, $R_2$ is a group containing at least one carbon atom, wherein $R_1$ is selected from the group consisting of

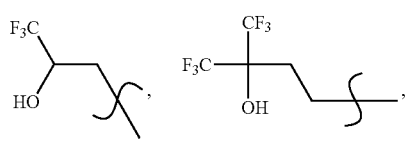

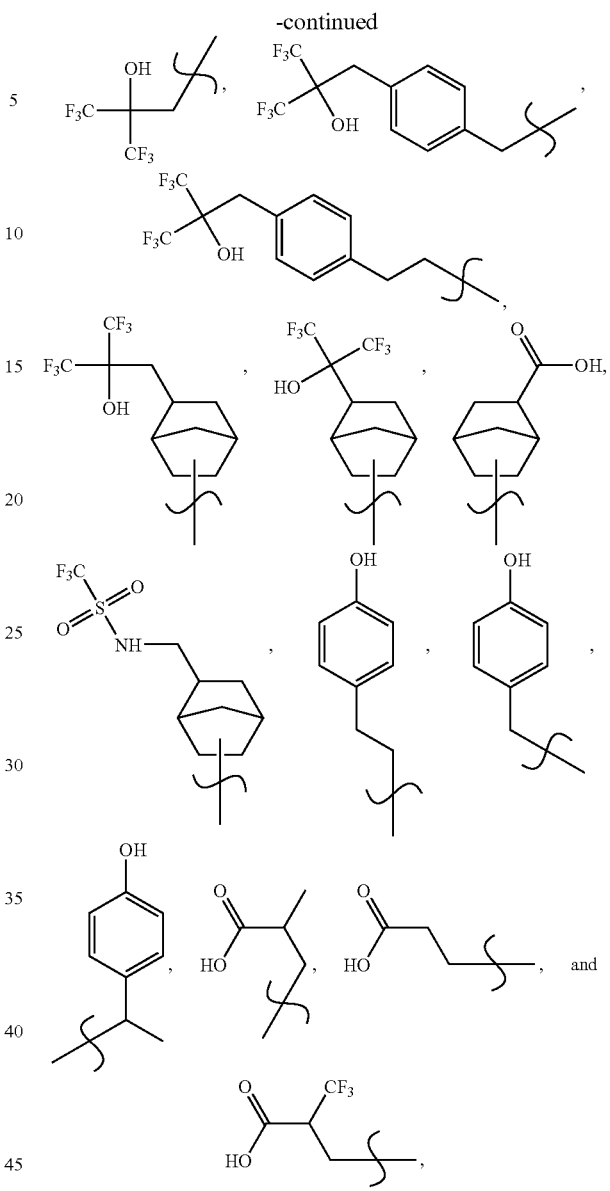

wherein said second polymer is described by the general formula:

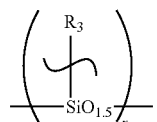

wherein x is an integer greater than zero and $R_3$ is a carbon functional group comprising at least one carbon atom, wherein said second polymer is configured to undergo chemical crosslinking upon sufficient exposure to light, thermal energy, or a combination thereof; and a photosensitive acid generator.

The present invention relates to a method of forming a relief pattern on a substrate, comprising:

forming a film of the composition of claim 1 on the substrate;

patternwise imaging said film through a mask, wherein at least one region of said film is exposed to radiation, resulting in production of an acid catalyst in said at least one exposed region of said film;

after said imaging, baking said film, resulting in inducing crosslinking in said at least one exposed region of said film, wherein said crosslinking renders said exposed region insoluble in aqueous base;

after said baking, developing said film in an aqueous base solution, resulting in removal of base-soluble unexposed regions of said film, wherein a relief pattern from said film remains following said removal; and curing said relief pattern.

The present invention relates to a composition, comprising:

a polymer blend comprising a first silsesquioxane polymer and a second silsesquioxane polymer, wherein said first silsesquioxane polymer is described by the general formula:

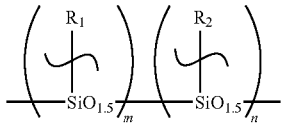

where m and n are integers in a range from about 1 to about 5000, $R_1$ is

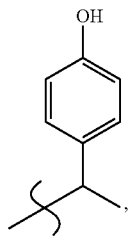

and $R_2$ is

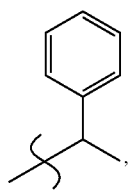

wherein said second silsesquioxane polymer is described by the general formula:

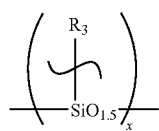

where x is an integer in a range from about 4 to about 50,000, and where $R_3$ is a methyl group, wherein said second silsesquioxane polymer comprises end groups configured to undergo photo-acid catalyzed condensation reactions upon sufficient exposure to light, thermal energy, or a combination thereof;

an organic base; and a photosensitive acid generator.

BRIEF DESCRIPTION OF THE DRAWINGS

The features of the invention are set forth in the appended claims. The invention itself, however, will be best understood by reference to the following detailed description of illustrative embodiments when read in conjunction with the accompanying drawings.

DETAILED DESCRIPTION OF THE INVENTION

Figure 1:
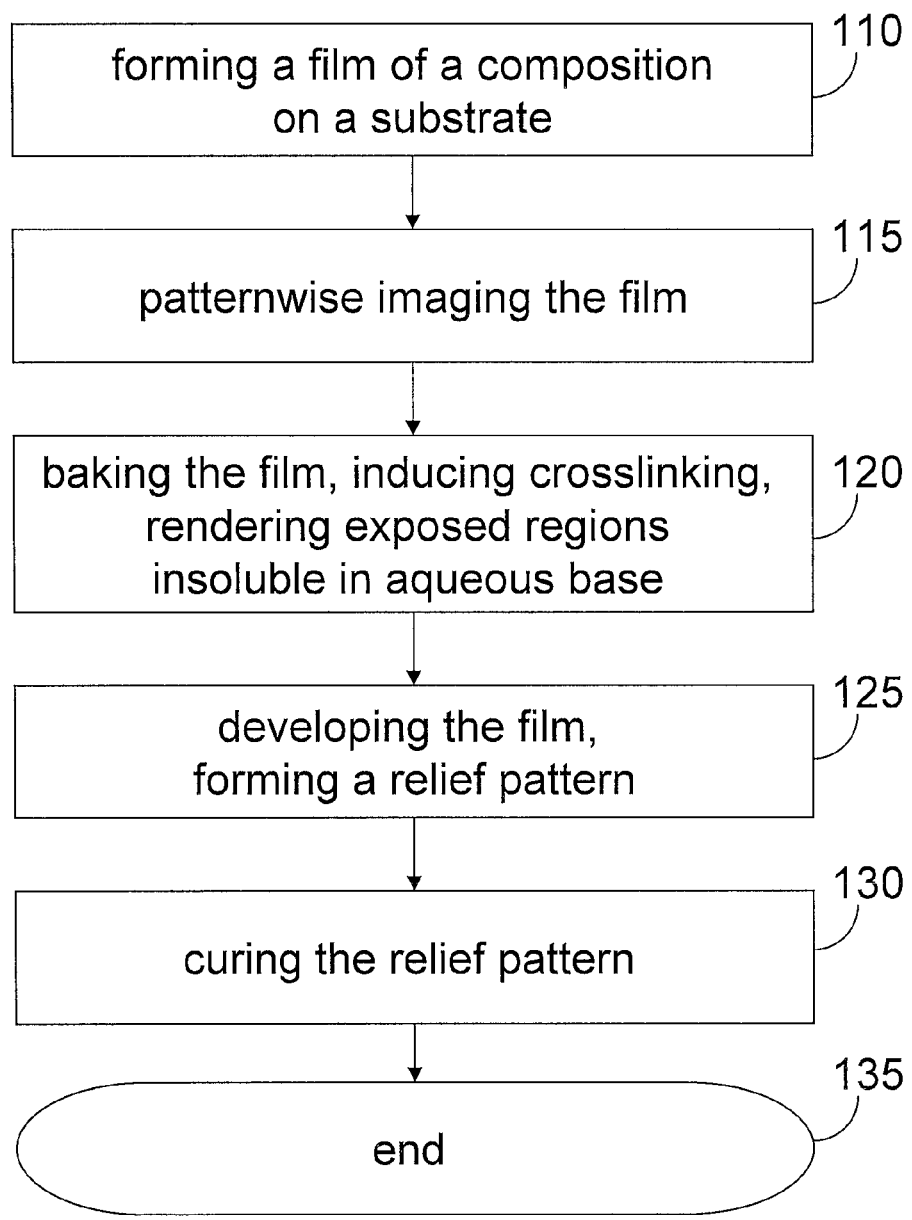
FIG. 1 is a flow chart illustrating a method for preparing a relief pattern, in accordance with embodiments of the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as examples of embodiments. The features and advantages of the present invention are illustrated in detail in the accompanying drawings, wherein like reference numerals refer to like elements throughout the drawings. Although the drawings are intended to illustrate the present invention, the drawings are not necessarily drawn to scale.

An embodiment of the present invention comprises a polymer blend as a photopatternable composition having a low dielectric constant (k). The composition may be used for on-chip electrical insulators and for forming relief patterns for on-chip interconnects such as those used in integrated circuits, for example. Unless otherwise specified the dielectric constants mentioned herein are measured relative to that of vacuum. The term "low-k" denotes a dielectric material having a dielectric constant that is less than 4.0. The blend composition may be comprised of at least two aqueous base soluble, silicon-containing polymers. At least one of the polymers may provide control over the rate of dissolution in aqueous base. Blending of materials may allow properties such as dissolution rate and aqueous base solubility to be appropriately adjusted. A second blend component may be a silicon-containing polymer which may possess acid-sensitive imageable functional groups (such as silanol end groups, for example) which may undergo condensation reactions in the presence of acid to form Si—O—Si bonds. The silsesquioxane polymers in the present invention may undergo photo-acid catalyzed crosslinking, thermally induced crosslinking, or a combination of these, such as condensation of silanol end groups, for example. The silicon-containing polymers may comprise organosilicates, silsesquioxanes, siloxane, and the like, and may be soluble in aqueous base or organic solvents.

One embodiment of the present invention may comprise a polymer blend of silsesquioxane polymers. The polymers in the blend may be miscible with each other. The first silsesquioxane polymer may be linear, branched, caged compound or combinations thereof having the following general structural formula:

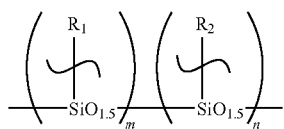

where, m and n represent the number of repeating units, $R_1$ represents a group which may comprise one or more functional groups which may provide polymer solubility in aqueous base, and $R_2$ represents a group which may comprise a carbon functionality which may control polymer dissolution in aqueous base. Subscripts m and n may be integers in the range from 0 to about 5000, such as 1 to about 5000 for example. $R_1$ may not be the same as $R_2$.

$R_1$ is not limited to any specific functional group, and may comprise functional groups which are substituted with —OH groups, —C(O)OH groups, —F, or combinations thereof. $R_1$ may comprise linear or branched alkyls, cycloalkyls, aromatics, arenes, or acrylics. For example, $R_1$ may be

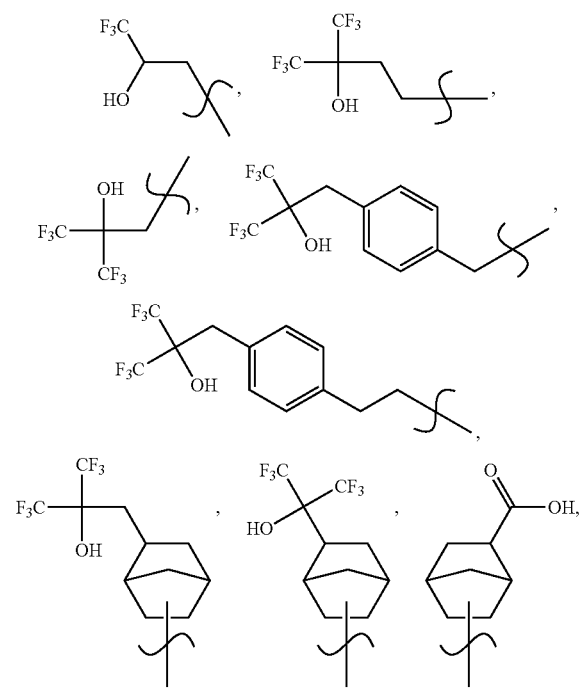

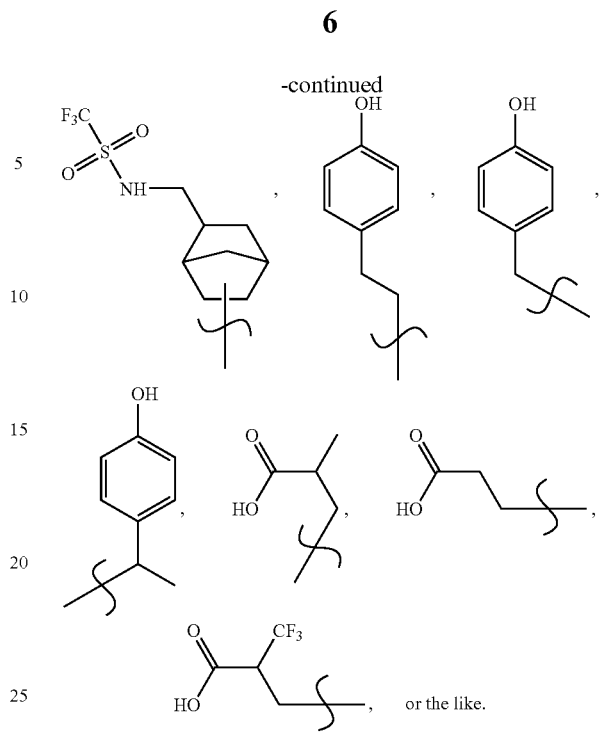

$R_2$ is not necessarily limited to any specific functional group, and may comprise linear or branched alkyls, cylcoalkyls, aromatics, arenes, acrylates, or combinations thereof. For example $R_2$ may be:

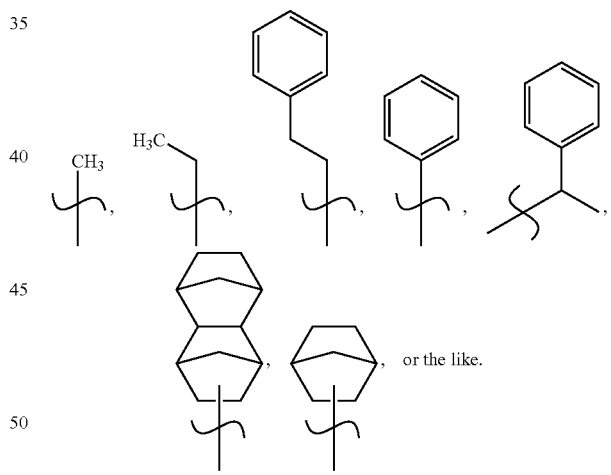

The $R_1$ and $R_2$ proportions and structures may be selected to provide a material suitable for photolithographic patterning processes.

The second silsesquioxane polymer may comprise a polymer having the structural formula:

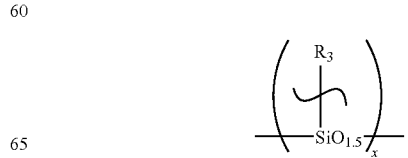

wherein $R_3$ may be a functional group comprising alkyls, cycloalkyls, aryl, or combinations thereof, and wherein x represents the number of repeating units and may be an integer in a range from 4 to 50000. For example, $R_3$ may be:

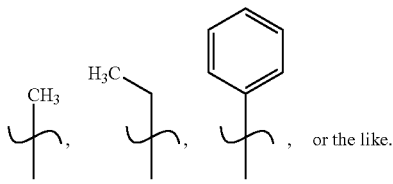

, or the like.

In one embodiment, the second silsesquioxane polymer may be poly(methylsilsesquioxane), where $R_3$ is a methyl group, and x is an integer from about 4 to about 1,000. In another embodiment, x may be greater than 1,000. The second silsesquioxane polymer may comprise a copolymer. The second silsesquioxane polymer structure may be caged, linear, branched, or combinations thereof. The silsesquioxane polymers of the present invention may comprise end groups comprising silanols, halosilanes, acetoxysilanes, silylamines, alkoxysilanes, and combinations thereof, which may undergo condensation reactions in the presence of an acid generated by a photoacid generator under sufficient exposure to radiation, followed by thermal baking at sufficient temperature, which may result in polymer crosslinking. Polymer molecules of the second polymer may undergo crosslinking with molecules of the first polymer, the second polymer, or a combination of these. In one embodiment of the present invention, the second silsesquioxane may be the methylsilsesquioxane polymer LKD 2021 or LKD-2056 (products of JSR Corporation) which contains silanol end groups.

The silsesquioxane polymers in the polymer blend may have a weight averaged molecular weight in the range from about 200 to about 5,000,000 g/mol, such as from about 1500 to about 10,000 g/mol, for example.

In one embodiment of the present invention, the composition comprising the polymer blend may further comprise a photosensitive acid generator (PAG) blended with the two blended polymers. The photosensitive acid generator may be miscible with the two polymers. Examples of some PAGs may comprise: (trifluoro-methylsulfonyloxy)-bicyclo[2.2.1]hept-5-ene-2,3-dicarboximide (MDT), N-hydroxy-naphthalimide (DDSN), onium salts, aromatic diazonium salts, sulfonium salts, diaryliodonium salts, and sulfonic acid esters of N-hydroxyamides, imides, or combinations thereof.

The concentrations of each of the silsesquioxane polymers in the blend formulation may be from about 1 to about 99% weight/weight (w/w) of the total polymer composition, for example, the concentration of the second silsesquioxane polymer may be from about 5% to about 95% of the total polymer composition. In one embodiment of the invention, the concentration of the acid sensitive polymer may be about 20% to about 80% w/w of the total polymer composition. In another embodiment, the composition of the acid sensitive polymer may be about 30% to about 60% w/w of the total polymer composition.

The composition of the present invention may further comprise an organic crosslinking agent, such as methylphenyltetramethoxymethyl glycouril (methylphenyl POWDERLINK), tetramethoxymethyl glycouril, methylpropyltetramethoxymethyl glycouril, or 2,6-bis(hydroxymethyl)-p-cresol. Photobase generators may also be used, within the scope of the present invention, for crosslinking silanol polymers. The photopatternable low-k composition of the present invention may further comprise a casting solvent to dissolve the other components. The casting solvent may be used to prepare a film of the composition. Suitable casting solvents may comprise solvents such as ethoxyethylpropionate (EEP), a combination of EEP and γ-butyrolactone, propylene-glycol monomethylether alcohol and acetate, propyleneglycol monopropyl alcohol and acetate, ethyl lactate, or combinations thereof.

In optimizing the photolithography process, the composition may further comprise an organic base. The base may be any suitable base known in the resist art. Examples of bases include tetraalkylammonium hydroxides, cetyltrimethylammonium hydroxide, 1,8-diaminonaphthalene, or a combination of these The compositions of the present invention are not limited to any specific selection of base.

FIG. 1 is a flow chart illustrating a method for preparing a relief pattern on a substrate in an embodiment of the present invention. In step 110, a film of a composition is formed on a substrate, where the composition may be a blend of two silicon containing polymers and a photosensitive acid generator as described above. The film may be formed by processes such as spin coating, spray coating, dip coating, doctor blading, and the like, which may be used individually and in combinations thereof in accordance with the methods of the present invention. The substrate may comprise materials of the Group I, II, III, and IV elements, plastic material, silicon dioxide, glass, fused silica, mica, ceramic, metals deposited on the aforementioned substrates, combinations thereof, and the like. For example, a substrate may comprise a prepared silicon wafer substrate such as those employed in semiconductor manufacturing. The film may be disposed on top of the substrate or may be integrally joined with the substrate.

In step 115, the film is imaged patternwise using a radiation source, resulting in the photosensitive acid generator producing an acid catalyst in the exposed regions of the film.

Figure 2:
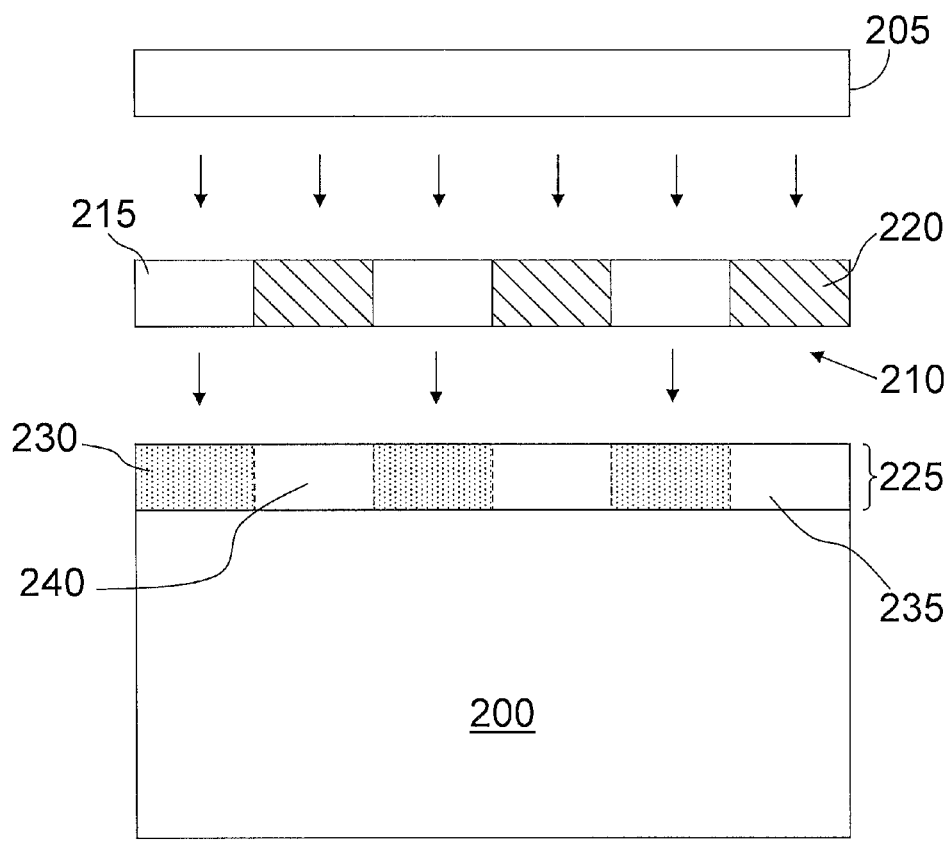
FIG. 2 is an illustration of patternwise imaging, in accordance with embodiments of the present invention.

FIG. 2 is an illustration of patternwise imaging, wherein a radiation source 205 projects radiation through a patterned mask 210 onto a film 225 disposed on a substrate 200. The mask may have a pattern of masked sections 220 which are substantially opaque to the radiation, and unmasked sections 215 which are substantially transparent to the radiation. Radiation passing through the unmasked sections 215 may be transmitted to the film 225 to be absorbed in the exposed regions 230 of the film 225, wherein the radiation may induce the production of an acid catalyst in the exposed regions 230 of the film 225. Unexposed regions 240 may not produce an acid catalyst. Exposure to the radiation (such as ultraviolet (UV) light at a wavelength from about 12 nm to about 1000 nm, electron beam radiation, plasma, etc.) followed by a post exposure bake may render the exposed regions 230 insoluble in a developer.

Referring again to FIG. 1, in step 120, the film is post exposure baked, which may induce crosslinking in the exposed regions of the film, rendering the exposed regions insoluble in aqueous base. Crosslinking of the functional groups (such as silanol end groups) to form interpenetrating lattices may increase the integrity of the patterned features following UV-thermal treatment while simultaneously producing a low-k insulating material (k<3.0). The post-exposure bake temperature of step 120 may be in the range from about 50° C. to about 200° C.

In step 125, the film is developed and the base soluble unexposed regions of the film may be removed from the film to leave a relief pattern remaining from the exposed, crosslinked regions of the film. The developer may be organic or aqueous based, such as an alkaline aqueous developer.

In step 130, the relief pattern is cured. A final curing step at a processing temperature compatible with back-end-of-line (BEOL) requirements may improve the patterned film properties, such as the dielectric constant, without detriment to pattern fidelity. Curing may include thermal treatment of at least 200° C. of the patterned and developed film, such as from about 300° C. to about 450° C. for example. Curing may utilize thermal treatment, UV radiation, electron beam irradiation, plasma, or combinations of these techniques, such as thermal treatment in combination with UV radiation, for example. The process ends at 135.

Where appropriate, the following techniques and equipment were utilized in the examples below: $^1$H and $^{13}$C NMR spectra were obtained at room temperature on an Avance 400 spectrometer. Quantitative $^{13}$C NMR was run at room temperature in acetone-$d_6$ in an inverse-gated $^1$H-decoupled mode using Cr(acac)$_3$ as a relaxation agent on an Avance 400 spectrometer. For polymer composition analysis $^{19}$F NMR (379 MHz) spectra were also obtained using a Bruker Avance 400 spectrometer. Thermo-gravimetric analysis (TGA) was performed at a heating rate of 5° C./min in $N_2$ on a TA Instrument Hi-Res TGA 2950 Thermogravimetric Analyzer. Differential scanning calorimetry (DSC) was performed at a heating rate of 10° C./minute on a TA Instruments DSC 2920 modulated differential scanning calorimeter. Molecular weights were measured using gel permeation chromatography (GPC) in tetrahydrofuran (THF) on a Waters Model 150 chromatograph relative to polystyrene standards. IR spectra were recorded on a Nicolet 510 FT-IR spectrometer on a film cast on a KBr plate. Film thickness was measured on a Tencor alpha-step 2000. A quartz crystal microbalance (QCM) was used to study the dissolution kinetics of the resist films in an aqueous tetramethylammonium hydroxide (TMAH) solution (CD-26). Modulus and hardness data were acquired using a nanoindentation method. Nanoindentation was performed with a Nano Intender XP system (Nano Instruments Innovation Center), equipped with the Dynamic Contact Module (DCM). The DCM may provide an overall miniaturization of the XP system, which may make it more suitable to perform indentations in low force ranges, such as 0.01 millinewtons (mN) to 12 mN). The DCM machine used a Berkovitch indenter (angle 65.3°). The Continuous Stiffness Measurement (CSM) option was used.

EXAMPLE 1

Synthesis of Poly(4-hydroxy-α-methylbenzylsilsesquioxane-co-α-methylbenzylsilsesquioxane) (6:4 pHMBS/MBS).

A mixture of 1-trichlorosilyl-1-(4-acetoxyphenyl)-ethane (223.2 grams; 0.75 mole), 1-trichlorosilyl-1-phenyl-ethane (125.8 grams; 0.525.1 mole), and 389 grams (g) of anhydrous tetrahydrofuran were added drop-wise to a rapidly stirred mixture of triethylamine (307.7 g; 4.2075 mole) and 389 g of deionized water while cooling with an ice bath to maintain the reaction temperature between about 0° C. and about 10° C. After the addition was complete, the mixture was stirred at a temperature between about 0° C. and about 10° C., for one hour. The cooling bath was removed and the mixture was allowed to warm to room temperature and stir for about 20 hours. The reaction mixture was placed in a separatory funnel and the lower layer was separated and retained. The upper layer was diluted with about 900 milliliters (ml) deionized water and extracted three times with about 450 ml of diethyl ether. The ether extracts were combined with the lower layer retained from the first separation and the ether solution washed four times with about 400 ml of about 2% aqueous hydrochloric acid, and three times with about 300 ml of saturated aqueous NaCl (brine). The ether solution was dried over anhydrous magnesium sulfate, filtered, and evaporated to yield 264.4 g of a hard foam product after drying under high vacuum to constant weight.

A 260 g portion of the dry foam was dissolved in about 260 g of toluene, heated to about 100° C. with stirring, 20 drops of about 50% w/w aqueous potassium hydroxide added, and the mixture heated to reflux under nitrogen while collecting azeotroped water in a Dean-Stark trap. After refluxing the reaction mixture for about 36 hours, the reaction temperature had increased from about 103.8° C. to about 110.4° C. GPC analysis of an aliquot taken from the reaction mixture indicated that the molecular weight was in the range of about 3,000 to about 3,500 grams/mole (g/mol). The reaction mixture was cooled and precipitated in about 10 liters of stirred hexanes, collected on a filter funnel and washed with 3×500 ml of hexanes. After drying to constant weight, about 220 g of solid was obtained.

The solid above was added portion-wise to a stirred mixture of 140 ml of aqueous ammonium hydroxide (12.4 N) in 1120 ml of methanol at about 50° C. The suspension was heated to reflux and became homogenous after about 20 minutes at reflux. The solution was refluxed for about 3 additional hours. The reaction solution was then cooled to about room temperature, and the polymer product was isolated by precipitation in a mixture of about 128.9 g of acetic acid and about 20 liters of deionized water. The solid product was isolated by filtration and washed with three approximately 1 liter portions of deionized water. Drying in a vacuum oven for several days at about 60° C. yielded 179 g of poly(HMBS/MBS) product.

EXAMPLE 2

Synthesis of Poly(4-hydroxy-α-methylbenzylsilsesquioxane-co-α-methylbenzylsilsesquioxane) (6:4 pHMBS/MBS) (Reduced Ion Content Process)

A mixture of 1-trichlorosilyl-1-(4-acetoxyphenyl)-ethane (223.2 g; 0.75 mole), 1-trichlorosilyl-1-phenyl-ethane (125.8 g; 0.525.1 mole), and 389 g of anhydrous tetrahydrofuran were added drop-wise to a rapidly stirred mixture of triethylamine (307.7 g; 4.2075 mole) and 389 g of deionized water while cooling with an ice bath to maintain the reaction temperature between about 0° C. and about 10° C. After the addition was complete, the mixture was stirred at a temperature between about 0° C. and about 10° C., for one hour. The cooling bath was removed and the mixture was allowed to warm to room temperature and stir for about 20 hours. The reaction mixture was placed in a separatory funnel and the lower layer was separated and retained. The upper layer was diluted with about 900 ml deionized water and extracted three times with about 450 ml of diethyl ether. The ether extracts were combined with the lower layer retained from the first separation and the ether solution washed four times with about 400 ml of about 2% aqueous hydrochloric acid, and four times with 400 ml of deionized water. The ether solution was evaporated to yield 261.0 g of a hard foam product after pumping under high vacuum to constant weight over several days.

A 100 g portion of the dry foam product above was dissolved in 100 g of toluene, along with 1.15 grams of a 40% w/w aqueous solution of tetrabutyl ammonium hydroxide, and was heated to reflux under nitrogen while collecting azeotroped water in a Dean-Stark trap. After refluxing the reaction mixture for about 36 hours, the reaction temperature had increased to 110.8° C. GPC of an aliquot taken from the reaction mixture indicated that the molecular weight was between about 3,000 to about 3,500 g/mol. The reaction mixture was cooled and precipitated in about 3.5 liters of stirred hexane, collected on a filter funnel and washed with three times with about 300 ml of hexanes. After drying to constant weight, approximately 81 g of solid was obtained.

The solid obtained above, and about 9 g from a second lot of the same reaction, was added portion-wise to a stirred mixture of 58 ml of aqueous ammonium hydroxide (12.4 N) in 464 ml of methanol at about 50° C. The suspension was heated to reflux and became homogenous after about 20 min at reflux. The solution was refluxed for an addition 3 hours. The reaction solution was then cooled to about room temperature, and the polymer product was isolated by precipitation in a mixture of about 53.4 g of acetic acid and about 7.4 liters of deionized water. The solid product was isolated by filtration and washed with about three 500 ml portions of deionized water. The resulting solid was re-suspended in a mixture of about 3.7 liters of deionized water and about 30 grams of acetic acid, and then filtered, where this process of re-suspending and filtering was repeated three times. The solid was then re-suspended in about 3.7 liters of deionized water for about 4 hours and then filtered, where this process of re-suspending and filtering was repeated three times. Drying the product in a vacuum oven for several days at about 60° C. yielded about 73.6 g of poly(HMBS/MBS) product.

EXAMPLE 3

Photopatternable Blend Composition

A patternable low-k composition was formulated with 60 g of a 20 wt % solution of 6:4 pHMBS/MBS in propylene glycol monomethyl ether acetate (PGMEA), 40 g of a 20 wt % solution of the silsesquioxane copolymer LKD-2021, 2 g of a 20 wt % solution of triphenylsulfonium nonaflate in PGMEA, and 2 g of a 0.5 wt % solution of an organic base such as trioctylamine in PGMEA. The resulting patternable low-k formulation was filtered through a 0.2 micron (μm) filter.

The patternable low-k composition was spin coated (30 seconds at 2000 rpm) onto an 8 inch silicon wafer to produce an approximately 0.6 μm film. The wafer and film were pre-exposure baked at about 110° C. for about 60 seconds (s), pattern-wise exposed to 248 nm deep ultraviolet (DUV) light on an ASML (0.63 NA, 5/8 annular) DUV stepper, and then post exposure baked at 110° C. for 60 s. This was followed by two 30 s puddle development steps with 0.26 N TMAH developer to resolve 0.250 μm line and space features at a radiant energy dose of 26 millijoules/cm$^2$ (mj/cm$^2$).

Figure 3A:
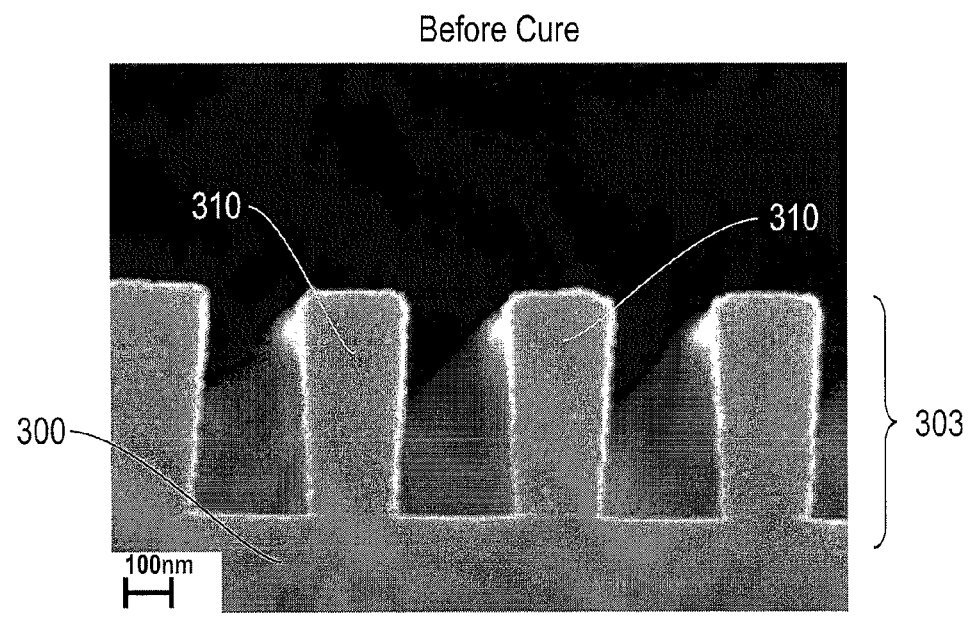
FIG. 3A is a scanning electron microscope (SEM) image of a 250 nanometer (nm) line pattern, in accordance with embodiments of the present invention.
Figure 3B:
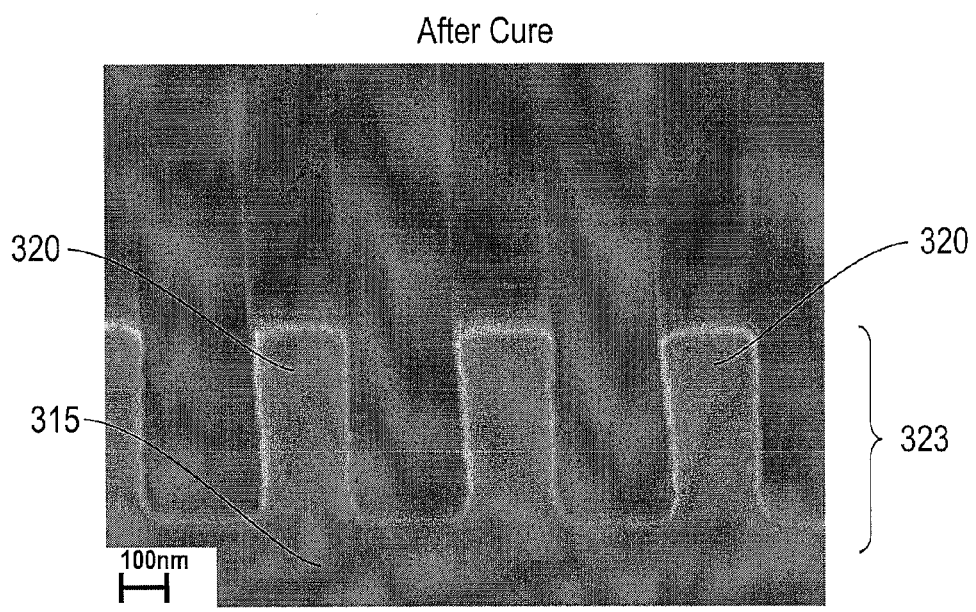
FIG. 3B is an SEM image of a 250 nm line pattern after ultraviolet-thermal curing, in accordance with embodiments of the present invention.

FIG. 3A is a scanning electron microscope (SEM) image of a 250 nm line pattern 310 created in a film 303 on a substrate 300 as described above in example 3. FIG. 3B is an SEM image of a 250 nm line pattern 320 created in a film 323 on a substrate 300 as described above in example 3, after the pattern has undergone a UV-thermal cure at 400° C. for 10 minutes, showing no loss in pattern fidelity as compared with the image of FIG. 3A.

EXAMPLE 4

Photopatternable Blend Composition

A patternable low-k composition was formulated with 60 g of a 20 wt % solution of 6:4 pHMBS/MBS in PGMEA, 40 g of a 20 wt % solution of the silsesquioxane copolymer LKD-2021, 2 g of a 20 wt % solution of triphenylsulfonium nonaflate in PGMEA, and 2 g of a 0.5 wt % solution of a base such as trioctylamine in PGMEA. The resulting patternable low-k formulation was filtered through a 0.2 μm filter.

The patternable low-k composition was spin coated onto an 8 inch silicon wafer and pre-exposure baked at about 110° C. for 60 s, pattern-wise exposed to 248 nm DUV light on an ASML (0.63 NA, 5/8 annular) DUV stepper, and post-exposure baked at about 110° C. for 60 s. This was followed by two 30 s puddle development steps at 12 mJ/cm$^2$ with 0.26 N TMAH developer to resolve 0.20 μm contact hole features. The contact hole pattern was subjected to a UV-thermal cure at 400° C. for 10 min. under a N$_2$ atmosphere. The resultant cured film exhibited no loss of pattern fidelity.

Figure 4A:
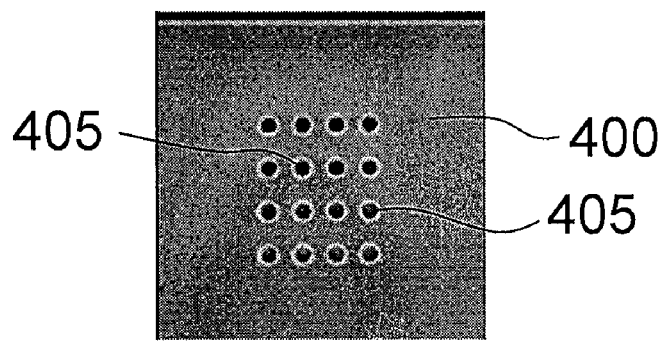
FIG. 4A is an SEM image of 0.20 μm contact holes in a film, in accordance with embodiments of the present invention.
Figure 4B:
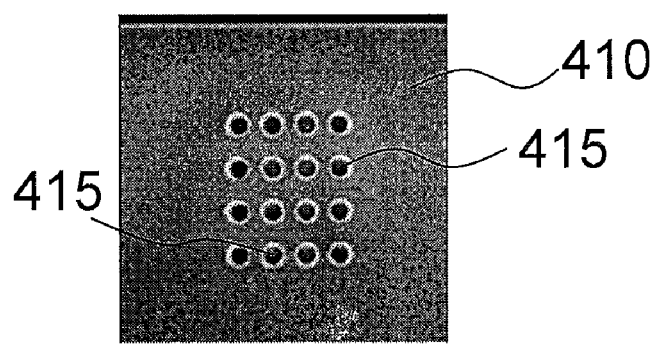
FIG. 4B is an SEM image of 0.20 μm contact holes in a film after ultraviolet-thermal curing, in accordance with embodiments of the present invention.

FIG. 4A is an SEM image of 0.20 μm contact holes 405 in a film 400 prepared as in example 4 above. FIG. 4B is an SEM image of 0.20 μm contact holes 415 in a film 410 prepared as in example 4 above, after the sample has undergone a UV-thermal cure at 400° C. for 10 minutes, showing no loss in pattern fidelity as compared with the image of FIG. 4A.

EXAMPLE 5

Photopatternable Blend Composition

A patternable low-k composition was formulated with 60 g of a 20 wt % solution of 6:4 pHMBS/MBS in PGMEA, 40 g of a 20 wt % solution of the silsesquioxane copolymer LKD-2056, 2 g of a 20 wt % solution of triphenylsulfonium nonaflate in PGMEA, and 2 g of a 0.5 wt % solution of a base such as trioctylamine in PGMEA. The resulting patternable low-k formulation was filtered through a 0.2 μm filter.

The patternable low-k composition was spin coated onto an 8 inch silicon wafer and pre-exposure baked at 110° C. for 60 s, patternwise exposed to 248 nm DUV light on an ASML (0.63 NA, 5/8 annular) DUV stepper, and post exposure baked at 110° C. for 60 s. This was followed by two 30 s puddle development steps with 0.26 N TMAH developer to resolve 0.20 μm line and space features. The patterned array was subjected to a UV-thermal cure at 400° C. for 10 min. under a N$_2$ atmosphere. The resultant cured film exhibited no loss of pattern fidelity.

EXAMPLE 6

Pattern Integrity and Film Properties

The 250 nm line and space features in example 3 and 200 mm contact hole features in example 4 were subjected to a UV-thermal cure at 400° C. for 10 min under a N$_2$ atmosphere in an 8 inch Applied Materials Producer broadband UV cure tool and showed no loss in pattern fidelity. The resultant UV cured blanket film of the formulation in examples 3 and 4 had a dielectric constant of 2.63 and 2.59 measured by 4 point probe method with a metal-on-semiconductor structure at 23° C. and 150° C., respectively.

The resultant UV cured blanket film of the formulation in examples 3 and 4 had a modulus of 3.4 gigapascals (GPa), a hardness of 0.37 GPa as measured by a nanoindentation method, a films stress of 45 MPa by a wafer bending method and a crack growth rate of 3.5×10$^{-10}$ m/sec in water.

The foregoing description of the embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

What is claimed:

1. A method of forming a relief pattern on a substrate, comprising:

forming a film of a composition on the substrate said composition comprising a polymer blend comprising a first polymer and a second polymer, wherein said first polymer is described by the general formula:

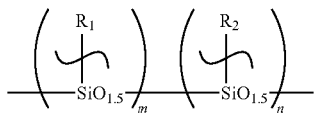

wherein m and n are integers in a range from 1 to about 5000, wherein $R_2$ is

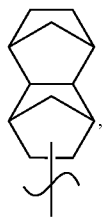

wherein $R_1$ is

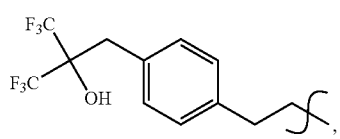

wherein said second polymer is a polysilsesquioxane having silanol end groups and a weight averaged molecular weight between about 1500 grams/mole and about 10,000 grams/mole, said second polymer described by the general formula:

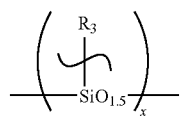

wherein x is an integer between about 4 and about 50,000, and wherein $R_3$ is

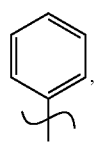

wherein said second polymer is configured to undergo chemical crosslinking with said first polymer, said second polymer, or a combination thereof upon sufficient exposure to light, thermal energy, or a combination thereof, said composition further comprising a photosensitive acid generator comprising N-(trifluoromethylsulfonyloxy)-bicyclo[2.2.1]hept-5-ene-2,3-dicarboximide, said composition further comprising an organic base comprising 1,8-diaminonaphthalene, said composition further comprising an organic crosslinking agent comprising 2,6-bis(hydroxymethyl)-p-cresol, said substrate comprising a silicon wafer;

patternwise imaging said film through a mask, wherein at least one region of said film is exposed to radiation having a wavelength of about 248 nanometers, resulting in production of an acid catalyst in said at least one exposed region of said film;

after said imaging, baking said film at a temperature between about 50° C. and about 200° C., resulting in inducing crosslinking in said at least one exposed region of said film, wherein said crosslinking renders said exposed region insoluble in aqueous base;

after said baking, developing said film in an aqueous base solution, resulting in removal of base-soluble unexposed regions of said film, wherein a relief pattern from said film remains following said removal; and curing said relief pattern at a temperature between about 300° C. and about 450° C., said curing comprising utilizing a combination of thermal treatment with UV radiation.

2. A composition, comprising:

a polymer blend comprising a first polymer and a second polymer, wherein said first polymer is described by the general formula:

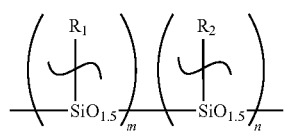

wherein m and n are integers greater than zero, $R_2$ is a group containing at least one carbon atom, wherein $R_1$ is

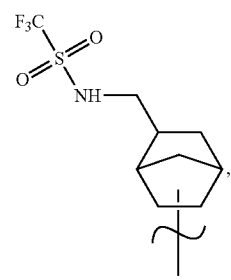

wherein said second polymer is described by the general formula:

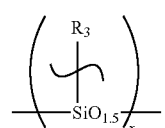

wherein x is an integer greater than zero and $R_3$ is a carbon functional group comprising at least one carbon atom, wherein said second polymer is configured to undergo chemical crosslinking upon sufficient exposure to light, thermal energy, or a combination thereof; and a photosensitive acid generator.

3. The composition of claim 2, wherein $R_2$ is selected from the group consisting of branched alkyls, cycloalkyls, aromatics, arenes, acrylates, and combinations thereof.

4. The composition of claim 2, wherein said second polymer is configured to undergo chemical crosslinking with said first polymer, said second polymer, or a combination thereof.

5. The composition of claim 2, wherein $R_3$ is selected from the group consisting of alkyls, cycloalkyls, aryls, and combinations thereof.

6. The composition of claim 5, wherein $R_3$ is selected from the group consisting of

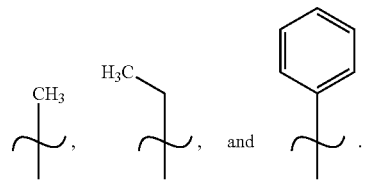

7. The composition of claim 2, wherein said second polymer has a molecular weight between about 400 g/mol and about 500,000 g/mol.

8. The composition of claim 2, wherein said photosensitive acid generator is selected from the group consisting of N-(trifluoromethylsulfonyloxy)-bicyclo[2.2.1]hept-5-ene-2,3-dicarboximide, onium salts, aromatic diazonium salts, sulfonium salts, diaryliodonium salts, sulfonic esters of N-hydroxyamides, sulfonic esters of N-hydroxyimides, N-hydroxy-napthalimide, and combinations thereof.

9. The composition of claim 2, wherein said composition further comprises an organic crosslinking agent.

10. The composition of claim 9, wherein said organic crosslinking agent is selected from the group consisting of methylphenyltetramethoxymethyl glycouril, tetramethoxymethyl glycouril, methylpropyltetramethoxymethyl glycouril, and 2,6-bis(hydroxymethyl)-p-cresol.

11. The composition of claim 2, wherein x is an integer between about 4 and about 50,000.

12. The composition of claim 2, wherein said second polymer is a polysilsesquioxane having end groups selected from the group consisting of silanol, halosilane, acetoxysilane, silylamine, and alkoxysilane.

13. The composition of claim 2, wherein said first polymer has a weight averaged molecular weight in the range from about 200 to about 5,000,000 g/mol.

14. The composition of claim 2, further comprising an organic base selected from the group consisting of tetraalkylammonium hydroxides, cetyltrimethylammonium hydroxide, 1,8-diaminonaphthalene, and combinations thereof.

15. The composition of claim 2, wherein m and n are in a range from 1 to about 5000.

16. The composition of claim 2, wherein the weight/weight concentration of said second polymer is in the range from about 5% to about 95% of the total composition.

17. A method of forming a relief pattern on a substrate, comprising:

forming a film of the composition of claim 2 on the substrate;

patternwise imaging said film through a mask, wherein at least one region of said film is exposed to radiation, resulting in production of an acid catalyst in said at least one exposed region of said film;

after said imaging, baking said film, resulting in inducing crosslinking in said at least one exposed region of said film, wherein said crosslinking renders said exposed region insoluble in aqueous base;

after said baking, developing said film in an aqueous base solution, resulting in removal of base-soluble unexposed regions of said film, wherein a relief pattern from said film remains following said removal; and curing said relief pattern.

18. The method of claim 17, wherein said curing comprises exposing said relief pattern to UV radiation, heat, electron beam irradiation, plasma, or combinations thereof.

19. The method of claim 17, wherein said curing comprises curing said relief pattern at a temperature greater than 200° C.

20. A composition, comprising:

a polymer blend comprising a first polymer and a second polymer, wherein said first polymer is described by the general formula:

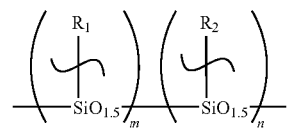

wherein m and n are integers greater than zero, $R_2$ is a group containing at least one carbon atom, wherein $R_1$ is selected from the group consisting of

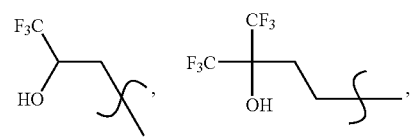

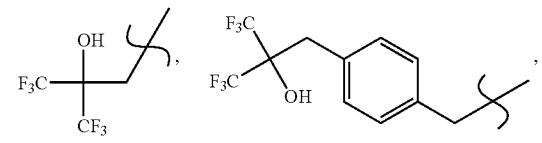

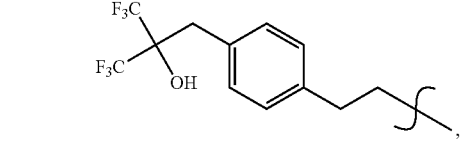

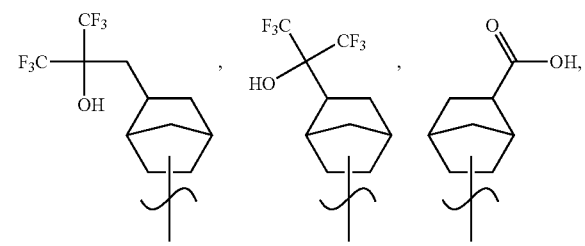

-continued

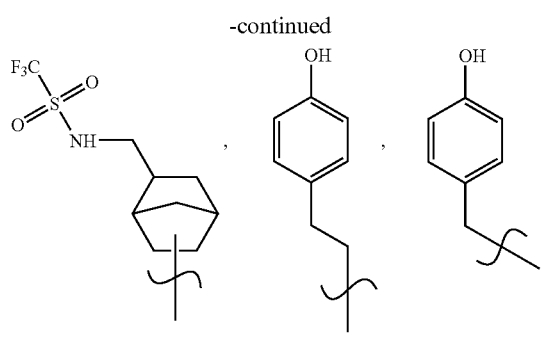

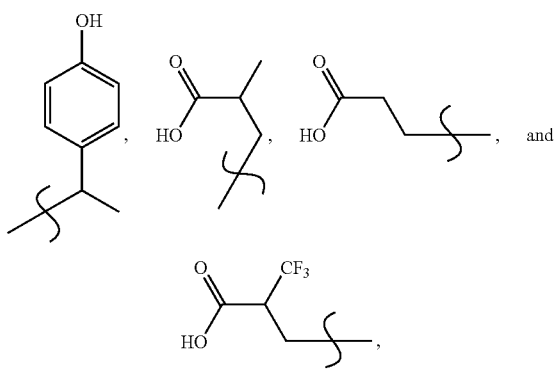

wherein said second polymer is described by the general formula:

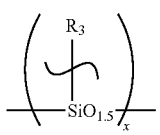

wherein x is an integer greater than zero and $R_3$ is a carbon functional group comprising at least one carbon atom, wherein said second polymer is configured to undergo chemical crosslinking upon sufficient exposure to light, thermal energy, or a combination thereof; and a photosensitive acid generator, wherein $R_2$ is selected from the group consisting of

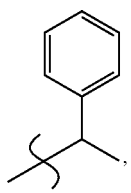

21. A composition, comprising:

a polymer blend comprising a first silsesquioxane polymer and a second silsesquioxane polymer, wherein said first silsesquioxane polymer is described by the general formula:

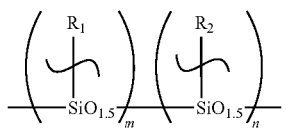

where m and n are integers in a range from about 1 to about 5000, $R_1$ is

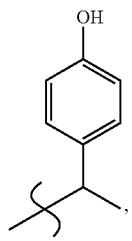

and $R_2$ is

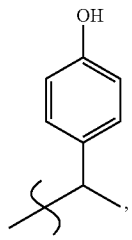

wherein said second silsesquioxane polymer is described by the general formula:

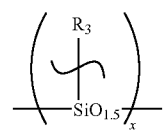

where x is an integer in a range from about 4 to about 50,000, and where $R_3$ is a methyl group, wherein said second silsesquioxane polymer comprises end groups configured to undergo photo-acid catalyzed condensation reactions upon sufficient exposure to light, thermal energy, or a combination thereof;

an organic base; and a photosensitive acid generator.

* * * * *